United States Patent
Skahill et al.

(10) Patent No.: US 6,211,696 B1
(45) Date of Patent: *Apr. 3, 2001

(54) HYBRID PRODUCT TERM AND LOOK-UP TABLE-BASED PROGRAMMABLE LOGIC DEVICE WITH IMPROVED SPEED AND AREA EFFICIENCY

(75) Inventors: Kevin B. Skahill, San Jose, CA (US); Haneef Mohammed, Beaverton, OR (US)

(73) Assignee: Cypress Semiconductor Corp., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/087,656

(22) Filed: May 30, 1998

(51) Int. Cl.[7] .................................................. H03K 19/177
(52) U.S. Cl. .................................. 326/41; 326/38; 326/39; 326/40; 326/41
(58) Field of Search .............................. 326/37, 38, 39, 326/40, 41

(56) References Cited

U.S. PATENT DOCUMENTS

| Re. 35,977 | 12/1998 | Cliff et al. ....................... 364/716.06 |
|---|---|---|
| 5,260,611 | 11/1993 | Cliff et al. .............................. 307/465 |
| 5,302,865 | * 4/1994 | Steele et al. ........................... 307/465 |
| 5,350,954 | 9/1994 | Patel ......................................... 326/39 |
| 5,352,940 | 10/1994 | Watson .................................... 326/44 |
| 5,670,896 | 9/1997 | Diba et al. .............................. 326/40 |
| 5,757,207 | * 5/1998 | Lytle et al. .............................. 326/39 |
| 5,764,078 | 6/1998 | Agrawal et al. ....................... 326/40 |
| 5,781,030 | 7/1998 | Agrawal et al. ....................... 326/39 |
| 5,799,176 | 8/1998 | Kapusta et al. ...................... 395/556 |
| 5,811,986 | 9/1998 | Agrawal et al. ....................... 326/39 |
| 5,815,726 | * 9/1998 | Cliff ................................... 395/800.01 |
| 5,821,774 | 10/1998 | Veytsman et al. ...................... 326/39 |
| 5,828,229 | * 10/1998 | Cliff et al. .............................. 326/40 |
| 5,838,628 | 11/1998 | Cliff et al. ....................... 365/230.03 |
| 5,841,295 | * 11/1998 | Kaviani ................................... 326/39 |
| 5,848,285 | * 12/1998 | Kapusta et al. ................. 395/800.01 |
| 5,898,318 | * 4/1999 | Pedersen ................................ 329/39 |
| 5,920,202 | * 7/1999 | Young et al. ........................... 326/39 |
| 5,966,027 | * 10/1999 | Kapusta et al. ....................... 326/39 |
| 5,969,543 | * 10/1999 | Erickson et al. ...................... 326/83 |
| 6,049,223 | * 4/2000 | Lytle et al. ............................. 326/40 |

* cited by examiner

Primary Examiner—Michael Tokar
Assistant Examiner—Vibol Tan
(74) Attorney, Agent, or Firm—Christopher P. Maiorana, P.C.

(57) ABSTRACT

A programmable device architecture that may improve functionality over look-up table based or product-term based programmable logic devices and that may provide for the efficient implementation of user-programmable logic designs resulting in implementations that may require less area and may provide increased performance. A product-term array (either fully or partially populated) may be placed in front of a number of LUT-based macrocells, utilizing the available routing wires as wordlines to form the product terms. The present invention takes advantage of existing routing to do more than just route signals from one point to another by allowing logic to be implemented in the same die area. The result is logic implementations that may require fewer total macrocells, fewer levels of macrocells, and fewer point-to-point nets (because logic density increases). The present invention may apply to FPGAs comprising an array of macrocells and to FPGAs comprising an array of clustered macrocells. The present invention may also be used with CPLDs by replacing the product term matrix, OR gates, and macrocells with LUT-based macrocells. The present invention may be used to implement logic functions in fewer macrocells than may be implemented in either LUT-based macrocells or product-term based macrocells alone.

20 Claims, 11 Drawing Sheets

FIG. 1
(CONVENTIONAL)

FIG. 2
(CONVENTIONAL)

FIG. 3
(CONVENTIONAL)

FIG. 4
(CONVENTIONAL)

FIG. 5
(CONVENTIONAL)

FIG. 6
(CONVENTIONAL)

HYBRID PRODUCT TERM AND LOOK-UP TABLE-BASED PROGRAMMABLE LOGIC DEVICE WITH IMPROVED SPEED AND AREA EFFICIENCY

FIELD OF THE INVENTION

The present invention relates to programmable logic devices generally and, more particularly, to a programmable logic device architecture that may improve functionality over look-up table based or product-term based programmable logic devices and that may provide for the efficient implementation of user-programmable logic designs resulting in implementations that may require less area and may provide increased performance.

BACKGROUND OF THE INVENTION

Field programmable gate arrays (FPGAs) typically consist of arrays of programmable macrocells (or arrays of clusters of programmable macrocells) and a programmable routing network. The programmable routing network is used to route signals between macrocells, between clusters of macrocells, and between the I/Os and macrocells. FPGA macrocells may contain one or more look-up tables (LUTs), a flip-flop, one or more programmable multiplexers, and control logic for flip-flop control signals, as well as carry chain and cascade chain logic.

Figure 1:
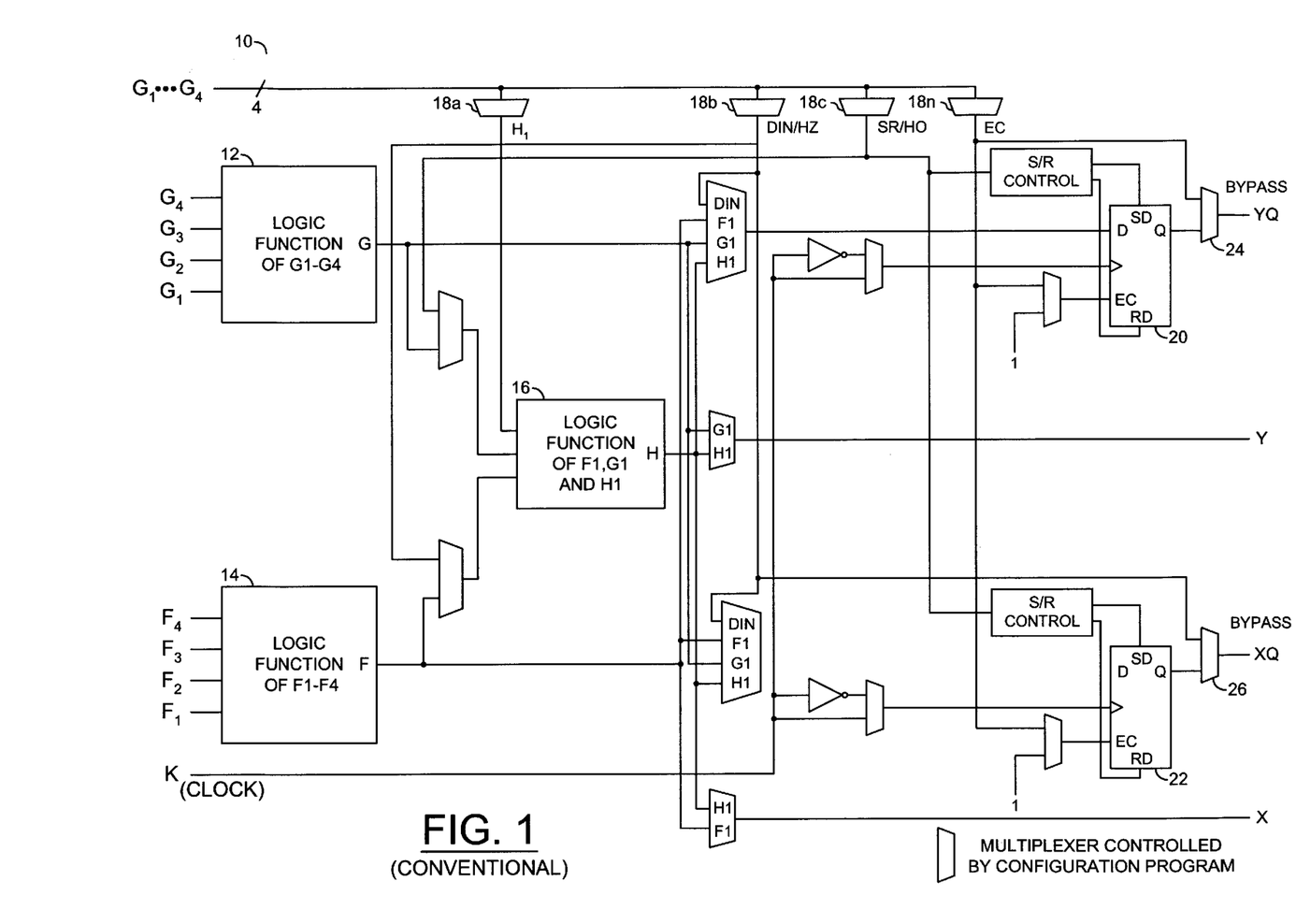
FIG. 1 is a block diagram of a conventional FPGA macrocell.

Referring to FIG. 1, one conventional FPGA macrocell 10 is shown comprising a look-up table 12, a look-up table 14, a look-up table 16, a number of configuration multiplexers 18a–18n, a flip-flop 20, and a flip-flop 22. The FPGA macrocell 10 is sometimes referred to as a logic element, a logic cell, a programmable function unit, a configureable logic block or other similar name.

Figure 2:
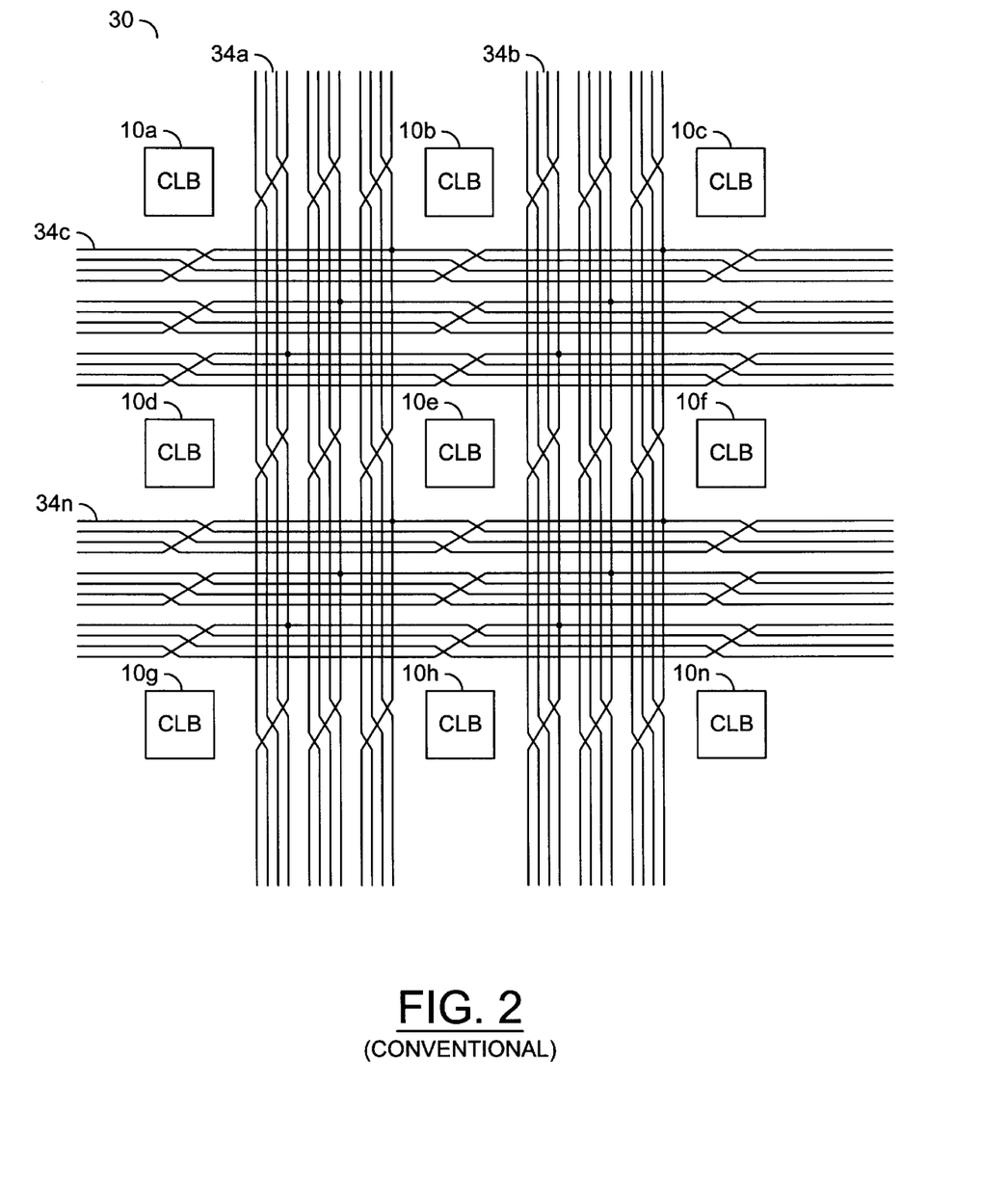
FIG. 2 is a block diagram of a number of FPGA macrocells and routing channels.
Figure 3:
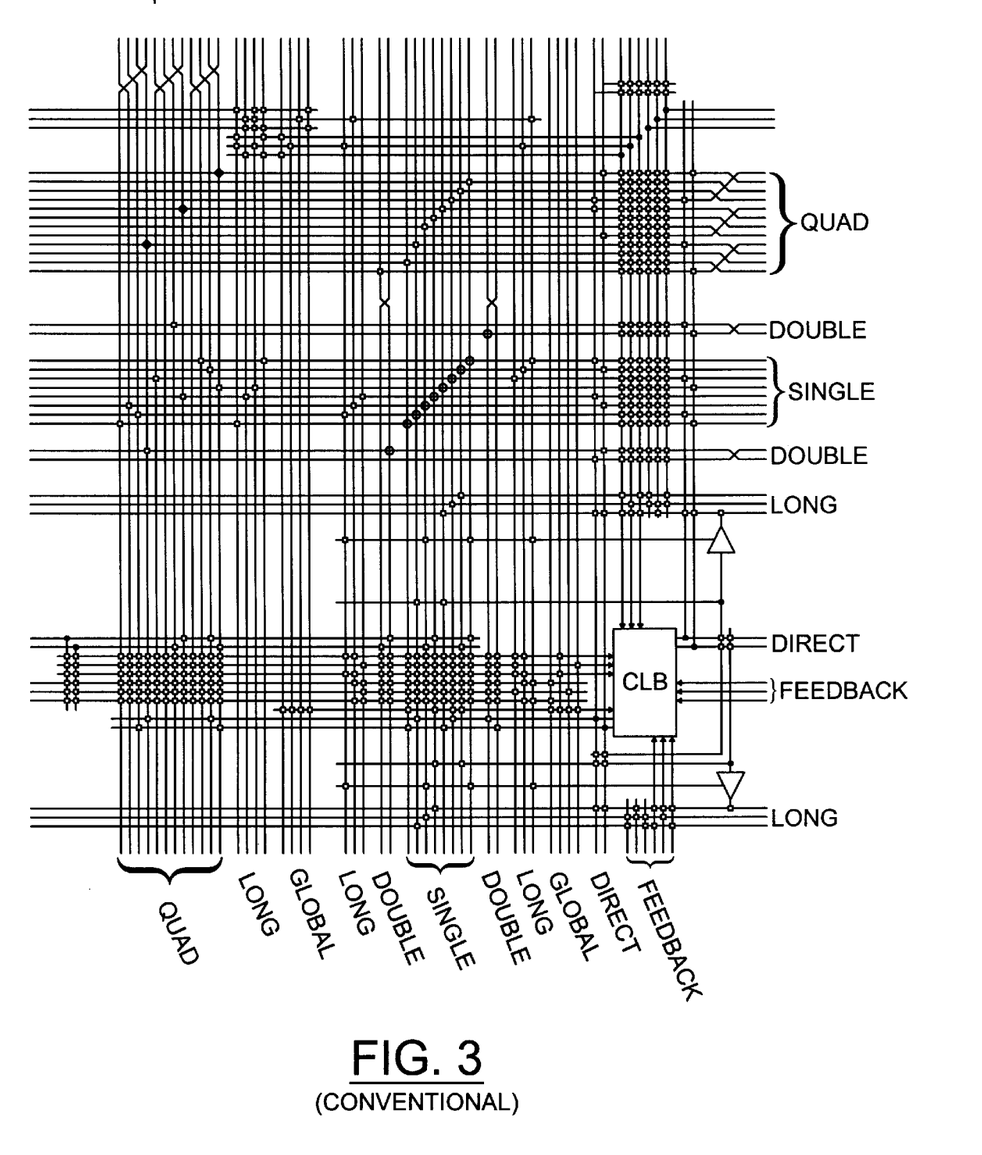
FIG. 3 is a block diagram showing the inputs and programmable connections to the macrocells.

Referring to FIG. 2, a portion of a typical FPGA 30 is shown made up of a number of FPGA macrocells 10a–10n. Programmable routing channels (34a–34n) are located between the FPGA macrocells 10a–10n and can be used to propagate signals from one of the macrocell 10a–10n to another and between input/output (I/O) and the macrocells 10a–10n. FIG. 3 illustrates a routing matrix 40 that can be implemented to produce the inputs to the various macrocells 10a–10n.

Logic functions are implemented in FPGA macrocell 10 by using (i) synthesis and technology mapping software to map logic into the macrocells, (ii) placement software to determine where to place logic within the array, and (iii) routing software to route the necessary signals in the programmable routing network.

Figure 4:
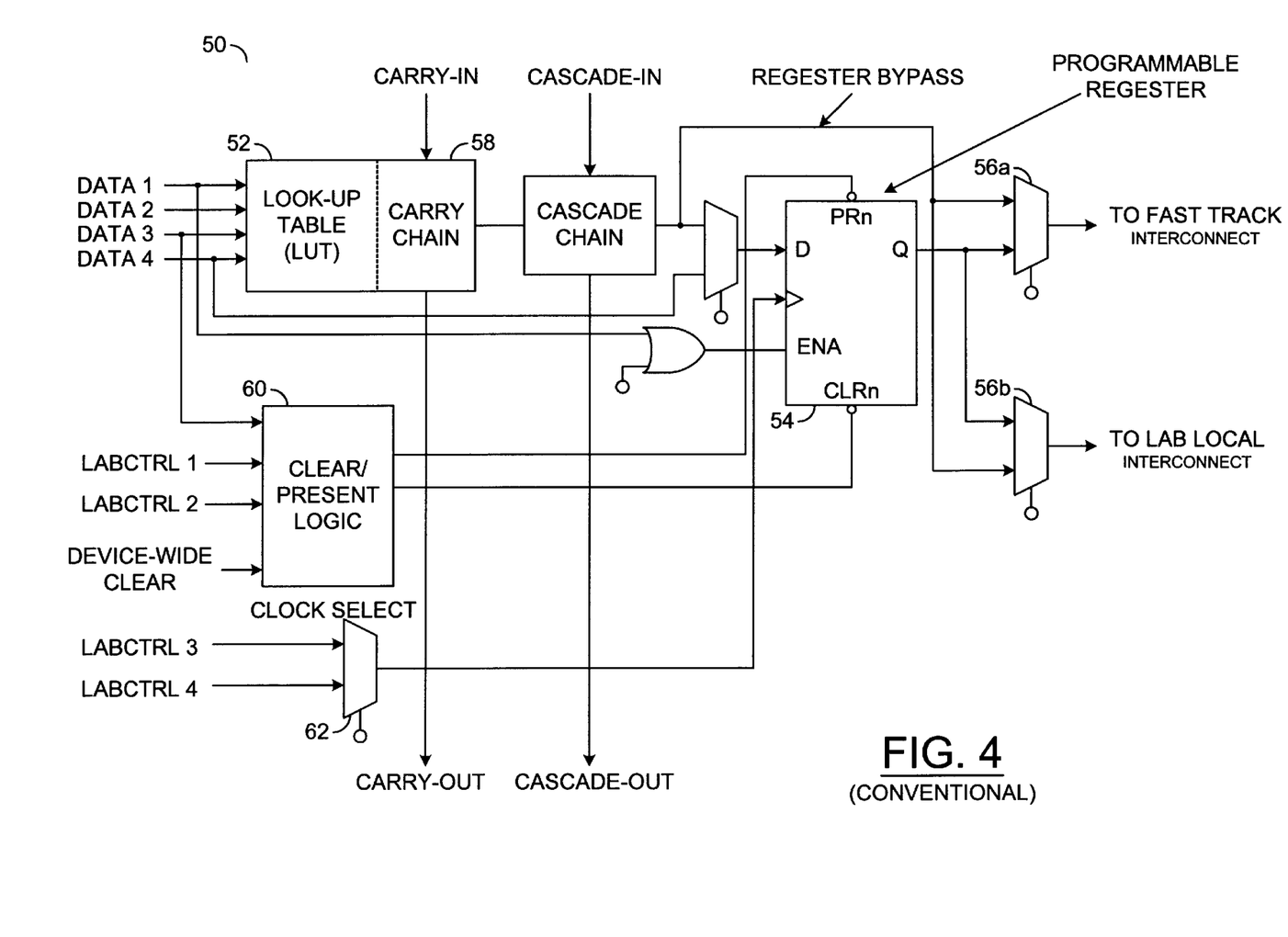
FIG. 4 is a block diagram of another conventional approach to implementing a FPGA.
Figure 5:
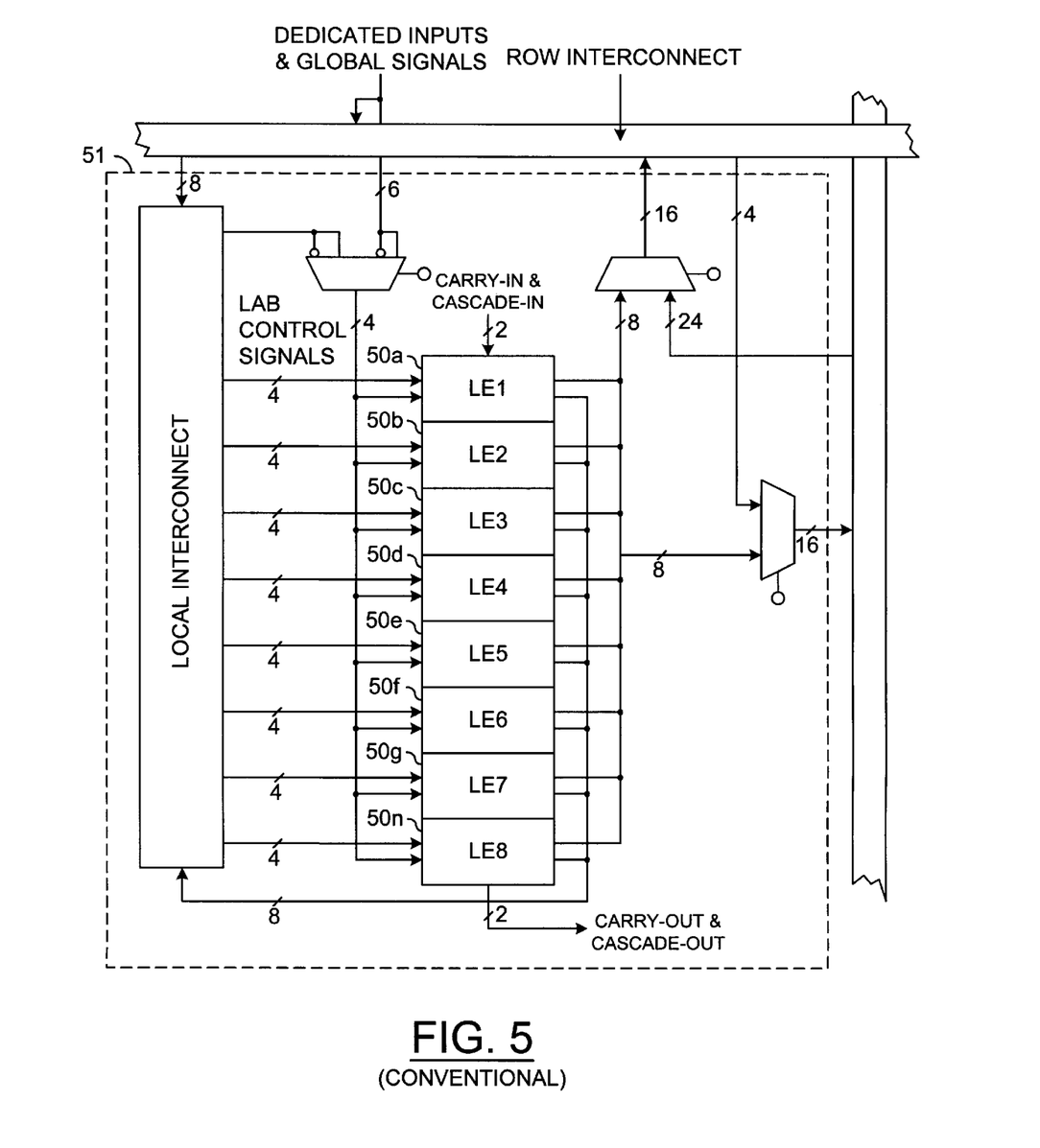
FIG. 5 is a diagram showing the clustering of the macrocells of FIG. 4.
Figure 6:
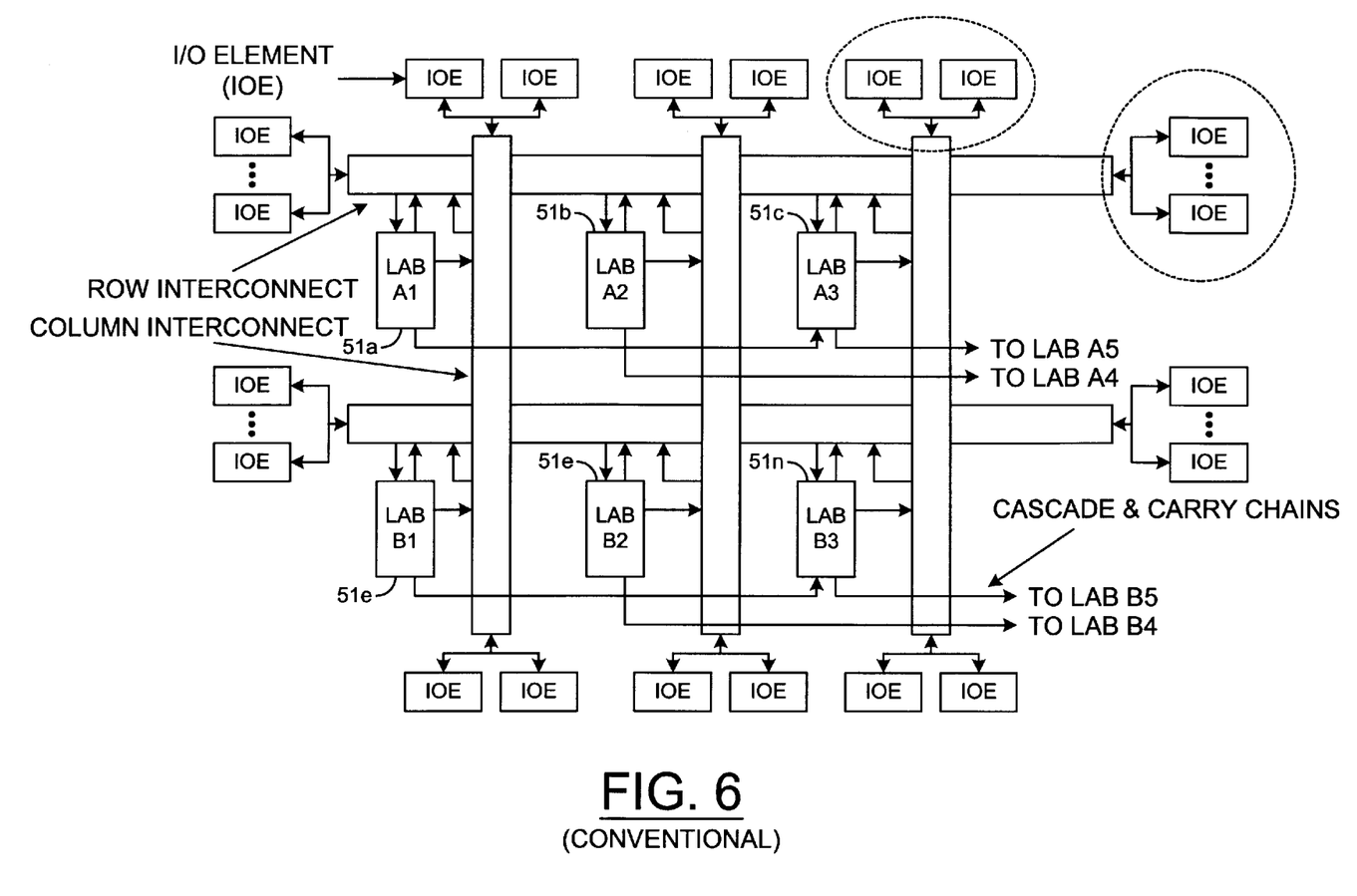
FIG. 6 is an array of clustered logic blocks illustrating a portion of an FPGA along with an associated routing network.

Referring to FIG. 4, another macrocell 50 in accordance with conventional methods shown. The macrocell 50 generally comprises a look-up table 52, a flip-flop 54, output multiplexers 56a and 56b, a carry chain logic 58, flip-flop control logic 60 and a clock select multiplexer 62. FIG. 5 illustrates a clustered logic block 51 comprising macrocells 50a–50n and a local programmable routing network. FIG. 6 illustrates an array of clustered logic blocks 51a–51n illustrating a portion of an FPGA along with an associated routing network.

Presently, complex programmable logic devices (CPLD) may contain a programmable routing network, multiple blocks comprising a product term array, a product term matrix, a number of OR-gates, and macrocells. The macrocells are comprised of a programmable flip-flop, programmable multiplexers, and sometimes an XOR gate or carry logic.

Logic functions are implemented in the CPLD by using synthesis and technology mapping software to map logic to the product-term array and associated macrocells. Partitioning and placement software is used to determine where to place logic within the CPLD.

Some conventional approaches have defined the terms FPGA and CPLD in different ways. In general, the distinction between FPGAs and CPLDs is blurring as both devices move to higher densities. For illustrative purposes, FPGAs will be considered to use LUTs as the basic building-block for implementing logic, and CPLDs will be considered to use product terms (e.g., programmable AND-OR planes) as the basic building block for implementing logic.

Some disadvantages of the LUT-based macrocell are that a LUT can only implement functions of up to the number of inputs to the LUT (usually between 3 and 5, inclusive). Complex functions usually must be implemented using a number of macrocells. Some commonly required functions cannot be efficiently implemented in just one macrocell. Functions requiring multiple macrocells utilize the macrocells inefficiently, wasting logic, routing resources, and die area, while degrading the performance of the implemented circuit.

One disadvantage of product-term based CPLDs with macrocells (e.g., where the input to a macrocell is an OR function of multiple product terms) is that some functions (e.g, a multiple input XOR function) often cannot be implemented efficiently in AND-OR logic. Arithmetic functions such as adders, subtractors, comparators, and parity trees are examples of functions that are not implemented efficiently with AND-OR logic.

SUMMARY OF THE INVENTION

The present invention concerns a programmable device architecture that may improve functionality over look-up table based or product-term based programmable logic devices and that may provide for the efficient implementation of user-programmable logic designs resulting in implementations that may require less area and may provide increased performance. A product-term array (either fully or partially populated) may be placed in front of a number of LUT-based macrocells, utilizing the available routing wires as wordlines to form the product terms. The present invention takes advantage of existing routing to do more than just route signals from one point to another by allowing logic to be implemented in the same die area. The result is logic implementations that may require fewer total macrocells, fewer levels of macrocells, and fewer point-to-point nets (because logic density increases). The present invention may apply to FPGAs comprising an array of macrocells and to FPGAs comprising an array of clustered macrocells. The present invention may also be used with CPLDs by replacing or supplementing the product term matrix, OR gates, and macrocells with LUT-based macrocells. The present invention may be used to implement logic functions in fewer macrocells than may be implemented in either LUT-based macrocells or product-term based macrocells alone.

The objects, features and advantages of the present invention include providing a product-term array with a look-up table-based macrocell in a FPGA or a CPLD that improves the area efficiency in implementing user designs as well as the speed of operation of the user designs.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 7:
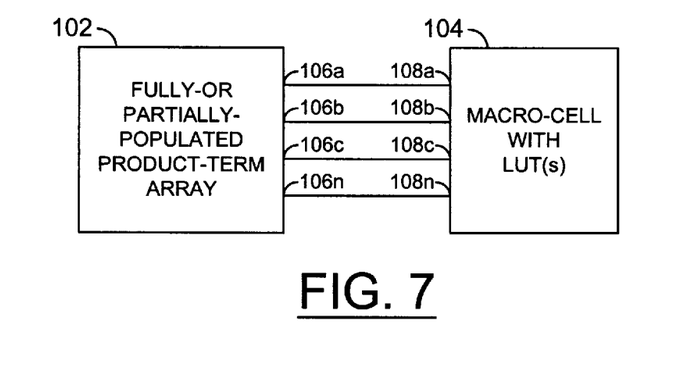
FIG. 7 is a block diagram of a preferred embodiment of the present invention.

Referring to FIG. 7, a block diagram of a circuit 100 illustrating a preferred embodiment of the present invention is shown. The circuit 100 comprises a product term array 102 and a macrocell 104. The product-term array 102 may be a fully or partially populated AND-type gate array. The macrocell 104 may be implemented as a LUT-based macrocell with one or more LUTs. A number of outputs 106a–106n of the product term array 102 may be presented to a number of inputs 108a–108n of the macrocell 104. The outputs 106a–106n may be presented to one or more of the inputs 108a–108n to macrocell 104 (e.g., the data inputs). A programmable routing network (not shown) provides the inputs to the product term array 102. The macrocell 104 is preceded with product terms from the product term array 102.

Figure 8:
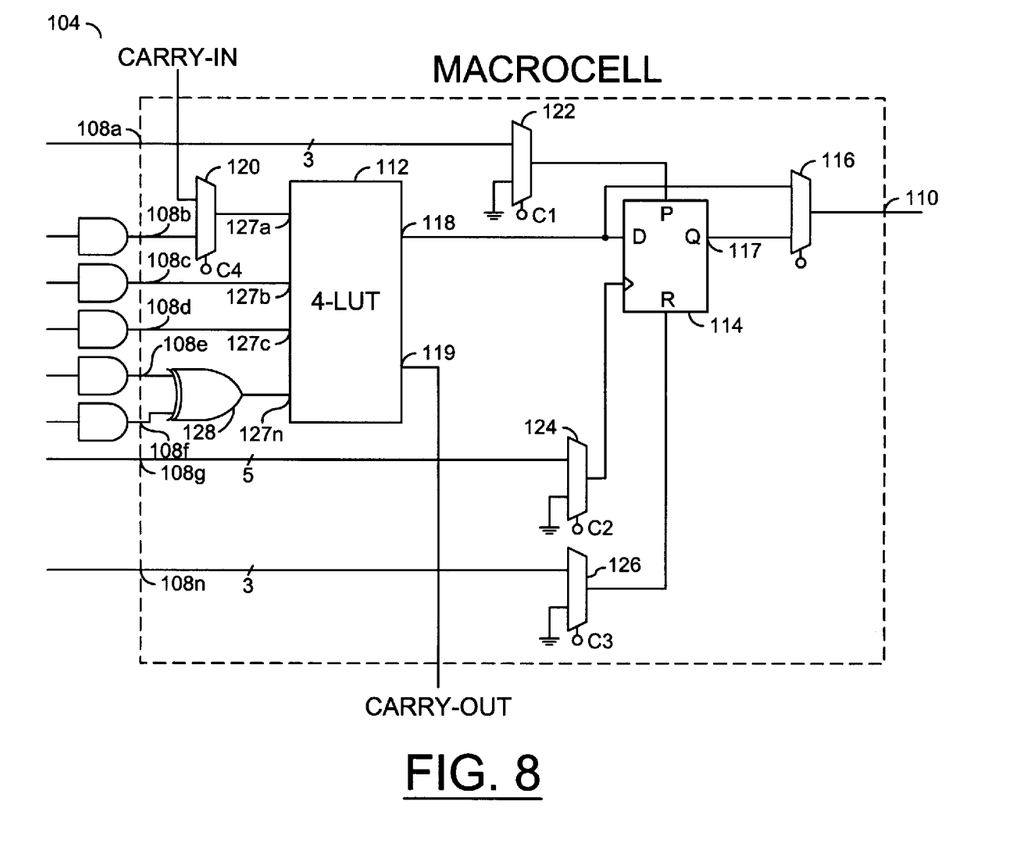
FIG. 8 is a more detailed block diagram of the macrocell of FIG. 7.

Referring to FIG. 8, a more detailed diagram of the macrocell 104 is shown. The LUT-based macrocell 104 is shown having product terms as the inputs 108a–108n from the product-term array 102 (shown in FIG. 7). The macrocell 104 comprises a LUT 112, a flip-flop 114, and output multiplexer 116. The LUT 112 may be implemented, in one example, as a four-input LUT. The flip-flop 114 may be implemented, in one example, as a D-type flip-flop. However, other variations of the LUT 112 and the flip-flop 114 may be implemented accordingly to meet the design criteria of a particular implementation. The output multiplexer 116 may select either a registered output 117 or a combinational output 118 from the LUT 112. In one example, the LUT 112 may be split into two smaller LUTs having fewer inputs to produce two functions of the same variables. This may be used, in conjunction with a configuration multiplexer 120, to implement a carry chain for fast adders and subtractors. Additional configuration multiplexers 122, 124 and 126 may be used to select the appropriate reset, preset, and clock signals. The width of the multiplexers 120, 122, 124 and 126 is shown for illustrative purposes only, and may each be implemented as multiplexers of varying widths. Although the LUT 112 has four data inputs 127a–127n, the macrocell has five data inputs (i.e., 108b–108f). In one example, two of the macrocell inputs (e.g., inputs 108e and 108f) are presented to a gate 128 which may have an output presented to one of the LUT inputs (e.g., input 127n). The gate 128 may be implemented, in one example, as an XOR gate. The gate 128 may be used to aid the efficient implementation of counters since the macrocell 104 is preceded by a product-term array 102.

Figure 9:
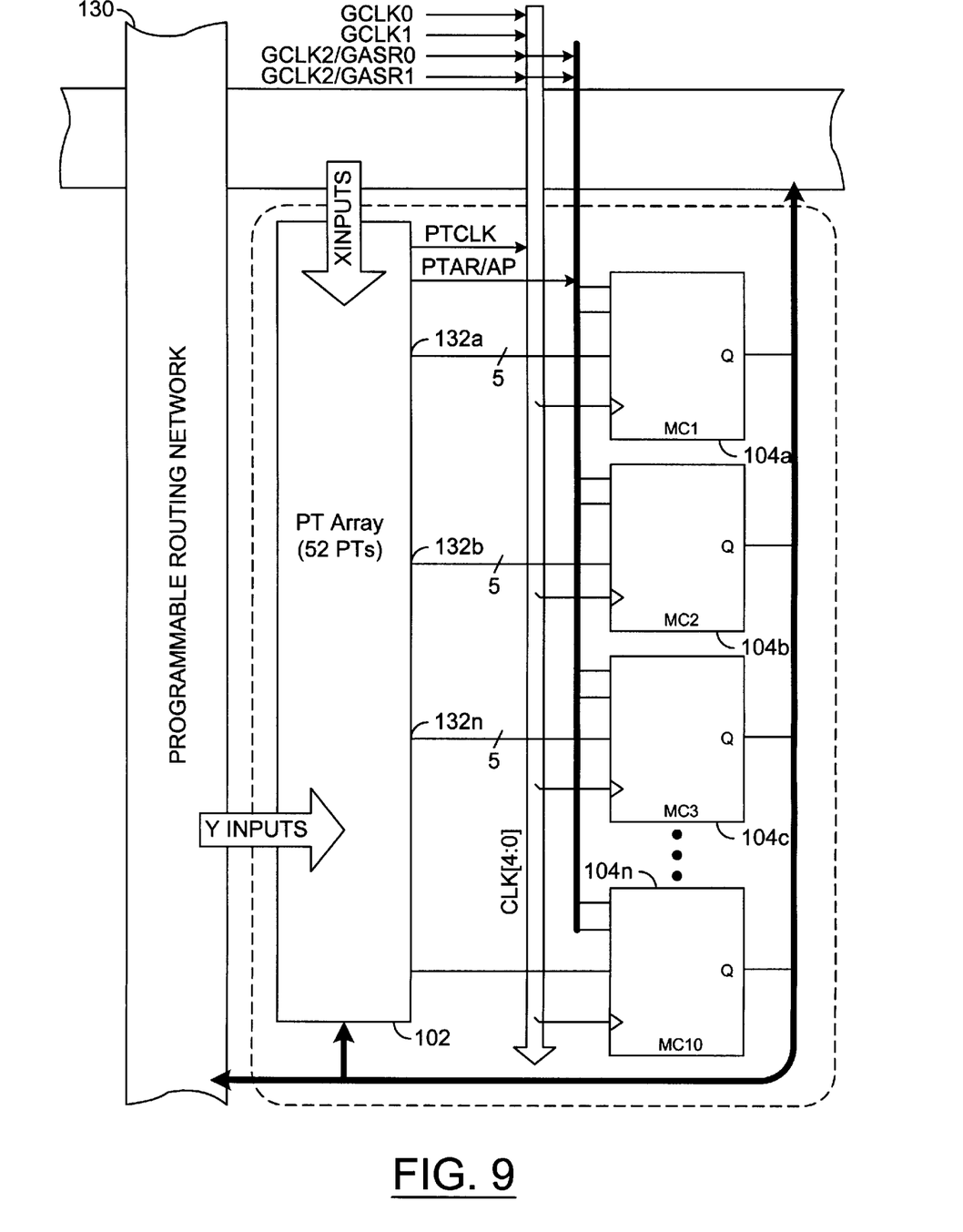
FIG. 9 is a block diagram illustrating how the present invention may be used with clustering of macrocells.

Referring to FIG. 9, a diagram illustrating a logic block incorporating the present invention in the context of an FPGA comprising a cluster of macrocells 104a–104n. A number of signals X and Y from a programmable routing network 130 may be presented to the cluster of macrocells 104a–104c through the product-term array 102. The signals X and Y generally serve as the wordlines to the product-term array 102. The product terms may then be distributed to the inputs of the macrocells 104a–104n. The signals X and Y may be selected using software that may comprise a medium that stores a series of instructions. For one embodiment, the software may be stored in a RAM including SRAM, DRAM or other types of RAM memory. The software may be accessed by a microprocessor, a microcontroller, etc.

The preferred embodiment illustrates that the five logic inputs to each of the macrocells 104a–104n in the cluster may be fed by product terms 132a–132n. In one example, each of the product terms 132a–132n may represent a number (e.g., 5) of product terms. However, a larger or smaller number of product terms may be implemented at each output 132a–132n in order to meet the design criteria of a particular implementation. The product terms 132a–132n may be used simply to route a signal into one of the macrocell inputs (which is the extent of the flexibility of the conventional approaches discussed in the background) or to implement logic functions such as logical AND, NAND, or NOR. By creating the product terms in the product-term array 102, the present invention may more efficiently implement functions of more variables and greater complexity, which may result in less required area and higher performance. The higher performance may be achieved despite the additional delay imposed by the product term array 102 since fewer levels of macrocells may be necessary to implement functions. Thus, the delay for a logic implementation using the present invention may be substantially better than the delay for a logic implementation using the conventional approaches due to multiple macrocell delays and the associated routing delays required to use multiple macrocells.

The following examples illustrate how the present invention provides improvements over conventional approaches. Consider the macrocell of FIG. 8 without the product terms. A simple design, which is used frequently in many (or most) designs, is a 4-to-1 multiplexer. This implementation is very area inefficient because, when implemented using conventional approaches, it requires the area of three macrocells plus the associated routing for implementation. The propagation delay of this implementation is large, the result of two levels of logic and routing.

Consider a 4-bit counter with synchronous clear, load, and enable implemented in the macrocell of FIG. 8. Without the product terms, each counter bit would require two macrocells compared to one macrocell with the product terms. Thus the present invention provides substantial performance and area efficiency gains.

The advantages to preceding a LUT-based macrocell with product terms used as inputs to the macrocell include improved performance and area efficiency. The present invention provides these advantages because it may implement functions of more variables and of greater complexity than conventional methods of using LUT-based macrocells or product-term arrays alone. Fewer levels of macrocells are required to implement many functions. This improves performance since multiple levels of macrocells are avoided. Area savings are gained by the use of fewer macrocells and routing.

Figure 10:
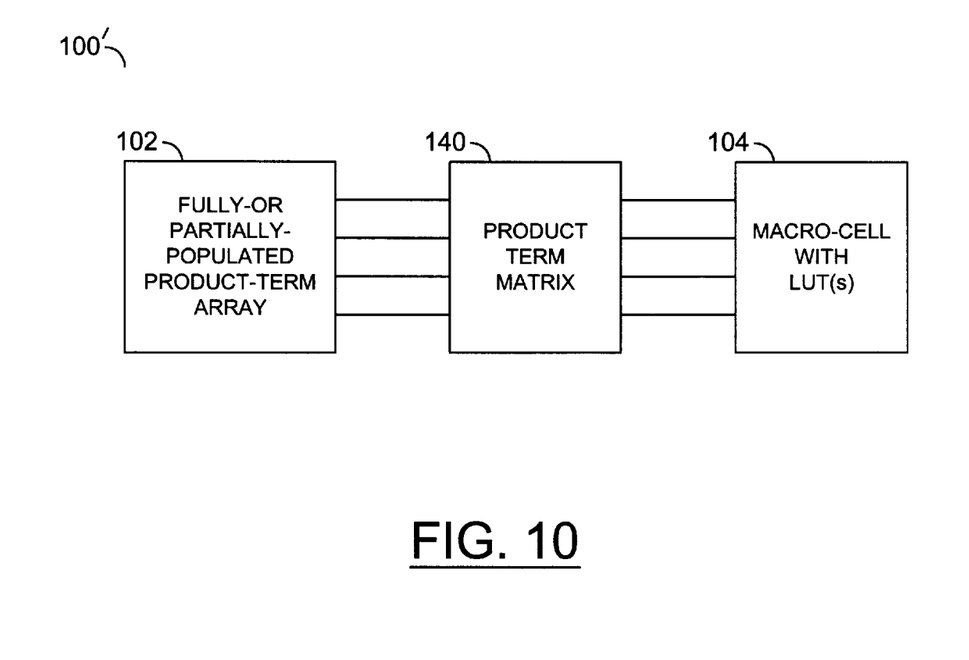
FIG. 10 is an alternate embodiment of the present invention.

Referring to FIG. 10, an alternate implementation of a circuit 100' is shown. The circuit 100' illustrates a product term matrix 140 placed after the product term array 102, but before a cluster of the macrocells 104. The product term matrix 140 may be used to distribute (e.g., steer or share) the product terms among the cluster of the macrocells 104.

Figure 11:
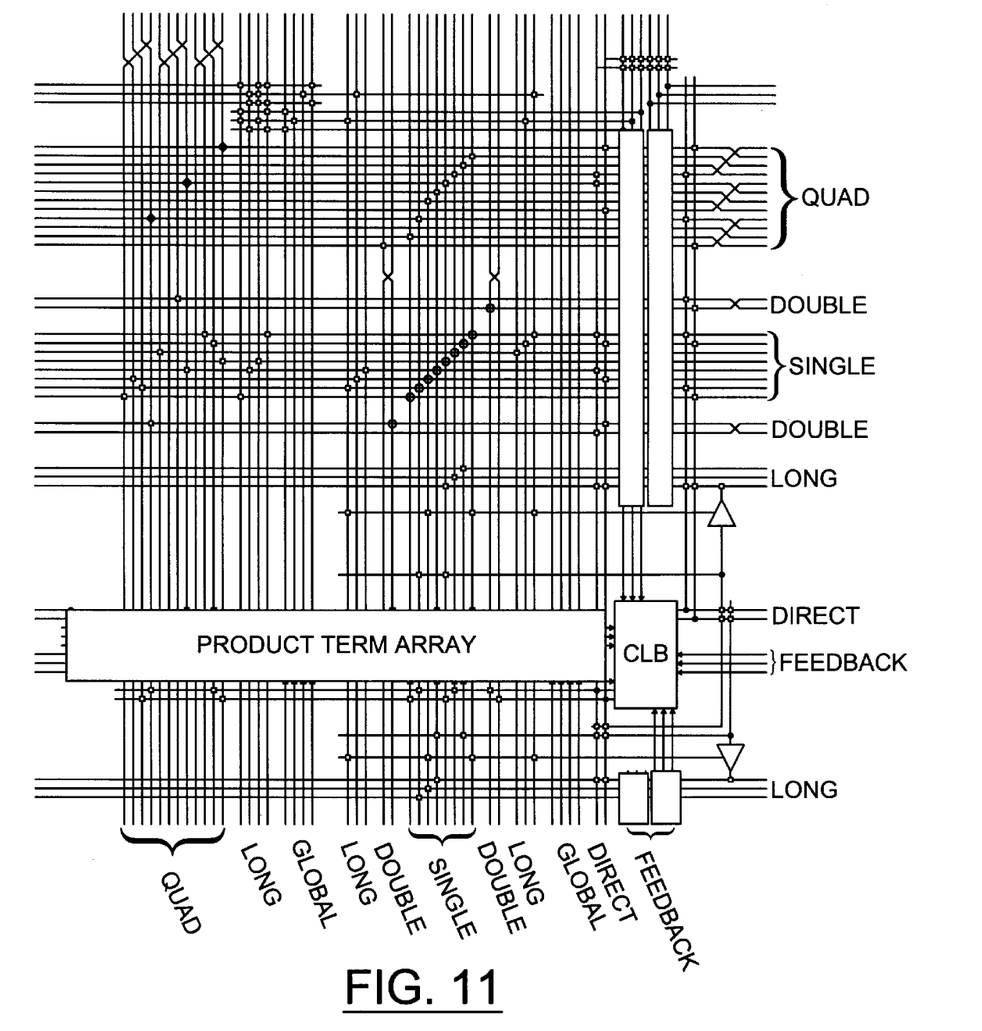
FIG. 11 illustrates the present invention as compared to the conventional approach of FIG. 3.

Referring to FIG. 11, the present invention is shown compared to the routing of FIG. 3. The routing of the conventional approach of FIG. 3 may be replaced by a product-term array (e.g., FIG. 11) in order to accomplish the desired objective of this invention (i.e., preceding LUT-based macrocells with product term arrays). The product-term array 102 may be partially or fully populated. The product-term array 102 may be fully populated by providing the true and complement of every signal that is received as an input. Alternatively, the product term array 102 may be partially populated by providing a mechanism for allowing some inputs to propagate in both true and complement form and others in only true or complement form. In addition, some signals in the routing channel will serve as inputs to the array, while others will bypass the array altogether. One example of a partially populated array may be found in co-pending application Ser. No. 09/046,960 filed on Mar. 24, 1998, which is hereby incorporated by reference in its entirety.

The result of the circuit 100' is an improved macrocell that combines a normal macrocell with product terms that are created in the routing channels. As with the previous embodiment, the circuit 100' may be modified by creating a partially-populated or fully-populated AND array.

Figure 12:
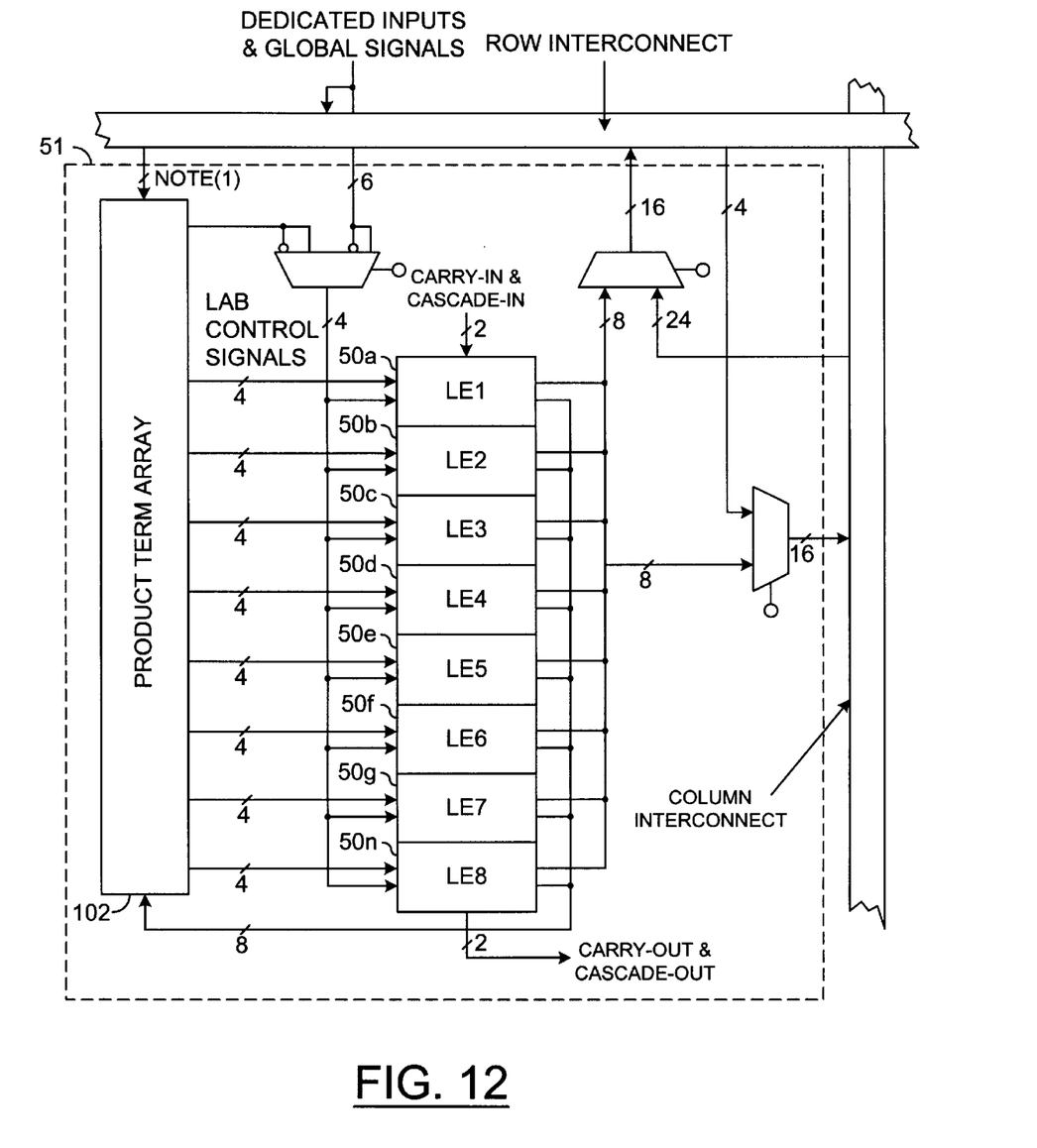
FIG. 12 illustrates the present invention compared to the conventional approach of FIG. 6.

Referring to FIG. 12, a comparison is shown compared to the circuit of FIG. 5. The inputs to the cluster of macrocells form the wordlines to a product term array 102. Each data input to a macrocell, in turn, is a product term output. The result is an improved cluster of macrocells that combines the prior macrocell with a product term array to provide substantial improvements in area and performance.

A related application of the principle of this invention is to implement a product term array in the channels of the FPGA of FIG. 11. The inputs to the cluster of logic blocks are themselves product terms.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
   a programmable routing network;
   an AND array configured to generate a plurality of product terms in response to one or more of a plurality of input signals from said programmable routing network; and
   a plurality of macrocells each including a look-up table having a first and a second table output, said macrocells configured to generate an output in response to one or more of said product terms, wherein an input to said look-up table comprises a logical combination of at least two of said product terms.

2. The circuit according to claim 1, wherein said plurality of macrocells each include one or more devices selected from a group consisting of a flip-flop, a multiplexer and a logic gate.

3. The circuit according to claim 1, wherein software interprets a description of logic to be fitted into the device and implements some portions of logic in the array and other portions of logic in the macrocells.

4. The circuit according to claim 2, wherein said macrocells comprise clustered macrocells.

5. The circuit according to claim 1, wherein said lookup table comprises a look-up table having a plurality of inputs.

6. The circuit according to claim 1, wherein said lookup table has a number of inputs different than the number of said product terms.

7. The circuit according to claim 1, wherein said AND array comprises a product-term array.

8. The circuit according to claim 1, wherein said AND array is configured to generate said product terms having either a true or a complement state.

9. A programmable logic device comprising the circuit of claim 1.

10. The circuit according to claim 1, wherein a carry signal is multiplexed with one of said product terms.

11. A circuit comprising:
    a programmable routing network;
    means for generating a plurality of product terms in response to one or more of a plurality of input signals from said programmable routing network; and
    means including a look-up table having a first and a second table output for generating an output in response to said one or more of said product terms, wherein an input to said look-up table comprises a logical combination of at least two of said product terms.

12. The circuit according to claim 11, wherein a carry signal is multiplexed with one of said product terms.

13. A programmable logic device comprising the circuit of claim 11.

14. The circuit according to claim 13, wherein said macrocells comprise clustered macrocells.

15. A circuit comprising:
    a programmable routing network;
    an AND array configured to generate a plurality of product terms in response to one or more of a plurality of input signals from said programmable routing network; and
    a plurality of macrocells each including a look-up table having an input comprising a logical combination of at least two of said product terms, said macrocells configured to generate an output in response to the outputs of one or more of said product terms, wherein software interprets a description of logic to be fitted into the device and implements some portions of logic in the array and other portions of logic in the macrocells.

16. The circuit according to claim 13, wherein said look-up table has a number of inputs different than the number of said product terms.

17. The circuit according to claim 13, wherein said AND array comprises a product-term array.

18. A programmable logic device comprising the circuit of claim 13.

19. The circuit according to claim 15, wherein said plurality of macrocells each include one or more devices selected from a group consisting of a flip-flop, a multiplexer and a gate.

20. The circuit according to claim 15, wherein a carry signal is multiplexed with one of said product terms.

* * * * *